United States Patent
Zhang et al.

(10) Patent No.: US 12,191,775 B2
(45) Date of Patent: Jan. 7, 2025

(54) THREE-LEVEL RECTIFICATION DC/DC CONVERTER

(71) Applicant: Delta Electronics (Shanghai) Co., Ltd., Shanghai (CN)

(72) Inventors: Chi Zhang, Apex, NC (US); Minli Jia, Shanghai (CN); Hao Sun, Shanghai (CN); Jinfa Zhang, Shanghai (CN); Peter Mantovanelli Barbosa, Cary, NC (US)

(73) Assignee: Delta Electronics (Shanghai) Co., Ltd., Shanghai (CN)

( * ) Notice: Subject to any disclaimer, the term of this patent is extended or adjusted under 35 U.S.C. 154(b) by 291 days.

(21) Appl. No.: 17/574,004

(22) Filed: Jan. 12, 2022

(65) Prior Publication Data
US 2023/0179107 A1    Jun. 8, 2023

(30) Foreign Application Priority Data

Dec. 2, 2021    (CN) .......................... 202111463234.6

(51) Int. Cl.
*H02M 3/335*    (2006.01)
*H02M 1/00*    (2007.01)
(Continued)

(52) U.S. Cl.
CPC ..... *H02M 3/33592* (2013.01); *H02M 1/0009* (2021.05); *H02M 1/0025* (2021.05); *H02M 1/083* (2013.01); *H03B 5/08* (2013.01)

(58) Field of Classification Search
CPC ........... H02M 1/0009; H02M 3/33592; H02M 1/0025; H02M 1/083; H02M 3/01; H02M 3/3507; H03B 5/08; Y02B 70/10
See application file for complete search history.

(56) References Cited

U.S. PATENT DOCUMENTS 6,934,167 B2 *  8/2005  Jang ........................ H02J 50/70
                                                    363/21.02
9,490,704 B2 * 11/2016  Jang .................. H02M 3/33571
(Continued)

FOREIGN PATENT DOCUMENTS

CN      1937380 A      3/2007
CN      1937382 A      3/2007
(Continued)

OTHER PUBLICATIONS

Liu Wenjin et al., A Bidirectional Three-Level Current-Fed DC/DC Converter Using Dual Phase Shift Modulation, IEEE, 2019, pp. 325-330.

(Continued)

*Primary Examiner* — Thienvu V Tran
*Assistant Examiner* — Yahveh Comas Torres
(74) *Attorney, Agent, or Firm* — KIRTON McCONKIE; Evan R. Witt

(57) ABSTRACT

The present disclosure provides a three-level rectification DC/DC converter including primary and secondary circuits and a resonant tank circuit. A voltage between two primary terminals is a first voltage. The secondary circuit includes two clamping switches, a switch bridge arm, and a capacitor bridge arm. The switch bridge arm includes four switches serially connected. The two clamping switches are connected in series between a node between the first and second switches and a node between the third and fourth switches. Two secondary terminals are respectively connected between the second and third switches and connected between two output capacitors of the capacitor bridge arm. A node between the two clamping switches is connected between the two output capacitors. The second and third switches are at least in an on state for a preset time length (Continued)

after falling and rising edges in a period of the first voltage respectively.

19 Claims, 17 Drawing Sheets

(51) Int. Cl.
*H02M 1/08* (2006.01)
*H03B 5/08* (2006.01)

(56) References Cited

U.S. PATENT DOCUMENTS

| | | | |
|---|---|---|---|
| 10,756,617 B2* | 8/2020 | Wei .................. | H02M 1/083 |
| 2009/0303753 A1 | 12/2009 | Fu et al. | |
| 2012/0218785 A1 | 8/2012 | Li et al. | |
| 2014/0268897 A1 | 9/2014 | Zimmanck | |
| 2015/0109830 A1* | 4/2015 | Xu ..................... | H02M 3/01 |
| | | | 363/21.03 |
| 2015/0229225 A1 | 8/2015 | Jang et al. | |
| 2016/0072398 A1* | 3/2016 | Deboy ............. | H02M 3/33592 |
| | | | 363/21.1 |
| 2017/0063251 A1 | 3/2017 | Ye et al. | |
| 2017/0324326 A1 | 11/2017 | Liu | |
| 2018/0152097 A1 | 5/2018 | Ying et al. | |
| 2018/0234022 A1 | 8/2018 | Ye et al. | |
| 2018/0337610 A1 | 11/2018 | Leong et al. | |
| 2019/0068069 A1 | 2/2019 | Sheng et al. | |
| 2020/0228017 A1 | 7/2020 | Hu et al. | |
| 2020/0228022 A1 | 7/2020 | Hu et al. | |
| 2020/0266719 A1 | 8/2020 | Oh | |
| 2020/0287466 A1 | 9/2020 | Sun et al. | |
| 2021/0067045 A1 | 3/2021 | Zhang et al. | |
| 2021/0226534 A1* | 7/2021 | Lu ..................... | H02M 3/01 |

FOREIGN PATENT DOCUMENTS

| | | | | |
|---|---|---|---|---|
| CN | 102624243 A | | 8/2012 | |
| CN | 103427657 A | | 12/2013 | |
| CN | 108900097 A | | 11/2018 | |
| CN | 109617441 A | | 4/2019 | |
| CN | 109889049 A | | 6/2019 | |
| CN | 110048613 A | | 7/2019 | |
| CN | 111082411 A | | 4/2020 | |
| CN | 111224553 A | * | 6/2020 | ........ H02M 3/33584 |
| CN | 112511007 A | | 3/2021 | |
| CN | 213151913 U | | 5/2021 | |
| CN | 113037096 A | | 6/2021 | |
| CN | 113541502 A | | 10/2021 | |
| CN | 113691140 A | * | 11/2021 | ............ Y02B 70/10 |
| EP | 3916984 A1 | | 12/2021 | |

OTHER PUBLICATIONS

Yang Dongjiang et al., High-Efficiency Bidirectional Three-Level Series-Resonant Converter with Buck-Boost Capacity for High-Output Voltage Applications, IEEE, 2021, pp. 969-982.

* cited by examiner

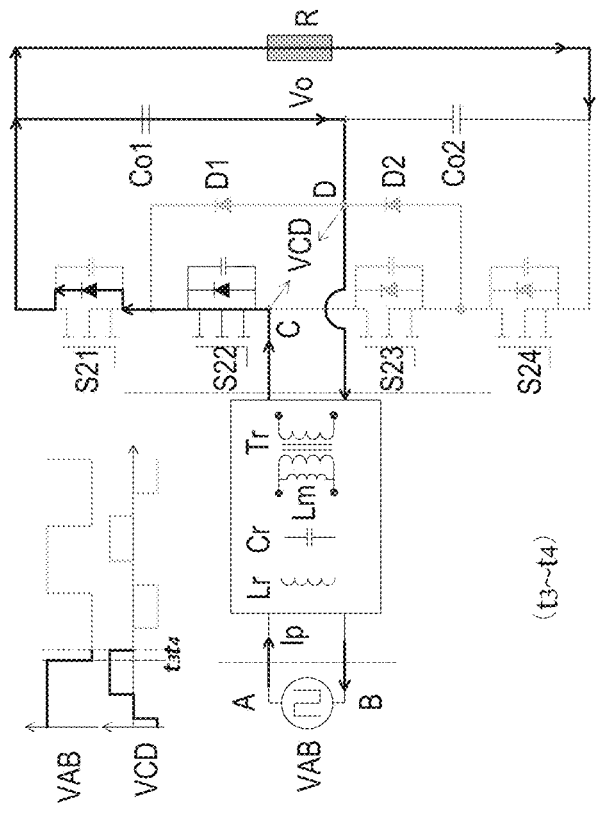
FIG. 5D (t3~t4)
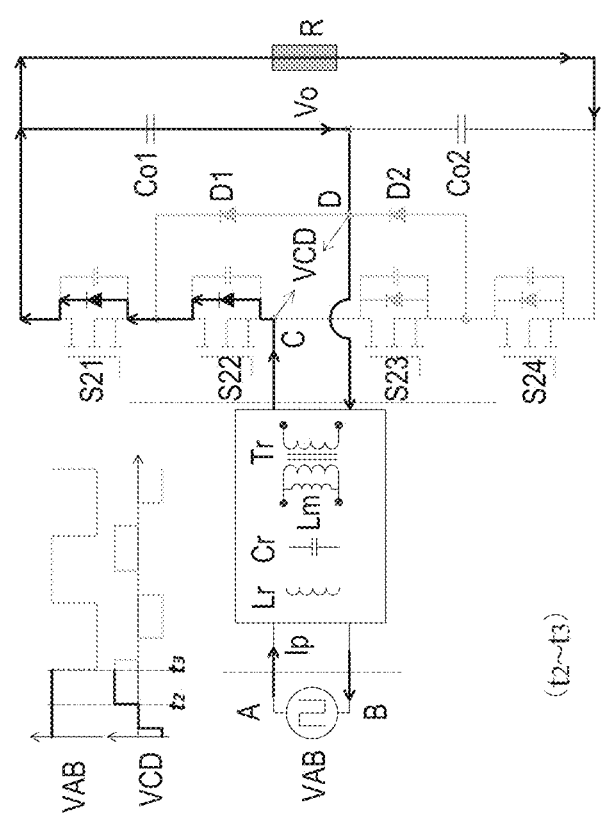
FIG. 5C (t2~t3)

THREE-LEVEL RECTIFICATION DC/DC CONVERTER

CROSS-REFERENCE TO RELATED APPLICATION

This application claims priority to China Patent Application No. 202111463234.6, filed on Dec. 2, 2021, the entire contents of which are incorporated herein by reference for all purposes.

FIELD OF THE INVENTION

The present disclosure relates to a DC/DC converter, and more particularly to a three-level rectification DC/DC converter.

BACKGROUND OF THE INVENTION

Low-voltage DC/DC converter, bidirectional OBC (onboard charger), and traction inverter are three main power conversion units. The OBC works as an energy conversion unit between AC power and DC power to supply power for power battery, and thus the OBC is necessary in the configuration of the electric vehicle. Recently, as the endurance of the electric vehicle keeps increasing, the battery voltage is changing from the conventional battery voltage of 400V to 800V, and the charging for the OBC is changing from single-phase charging to three-phase charging. Accordingly, the rectification voltage from AC power to DC power would reach 800V. Therefore, the primary and secondary circuits of the DC/DC converter would both relate to the applications with 800V.

As the conventional component with the withstand voltage of 650V can't be used, the SiC component with the withstand voltage of 1200 may be used instead. However, the cost is higher, and the high dv/dt caused by the SiC component may lead to EMI (electromagnetic interference) problem. In addition, although the wide-bandgap semiconductor device (GaN) is regarded as the development trend of power devices in the future, it is hard to be directly applied in the high-voltage (800V) work environment due to its limited withstand voltage. The multi-level technique can be utilized to overcome the said limitation, to expand the development and application of actual products.

With regard to applications with wide output voltage range in actual engineering, to meet the needs of high efficiency and high output voltage gain, the PWM (pulse width modulation) control with fixed frequency based on dual-active-bridge circuit and the resonant soft-switching control with variable frequency based on LLC circuit are usually used.

For the dual-active-bridge circuit, the multiple phase shift technique is taken to realize the zero-voltage switching of switches under the wide output range condition. However, the control therefor is relatively complicated, and the high turn-off current may cause high turn-off stress and EMI problem.

For the LLC circuit, the variable frequency control is taken to allow all the switches to achieve zero voltage switching, and it is relatively easy to implement the variable frequency control. However, the LLC is unable to meet the bidirectional work requirement in actual applications.

Therefore, there is a need of providing a three-level rectification DC/DC converter to overcome the drawbacks of conventional technologies.

SUMMARY OF THE INVENTION

The present disclosure provides a three-level rectification DC/DC converter which has the characteristic of a resonant circuit and can meet the bidirectional work requirement. In addition, the three-level rectification DC/DC converter has the characteristic of storing energy through short-circuiting the secondary circuit thereof, thereby achieving the output with high voltage gain.

In accordance with an aspect of the present disclosure, a three-level rectification DC/DC converter is provided. The three-level rectification DC/DC converter includes a primary circuit, a resonant tank circuit, and a secondary circuit. The primary circuit receives an input voltage and includes a plurality of primary switches. The resonant tank circuit includes a resonant inductor, a resonant capacitor, and a transformer. A first primary terminal and a second primary terminal of the resonant tank circuit are coupled to the primary circuit. A primary winding of the transformer is coupled between the first and second primary terminals. A secondary winding of the transformer is coupled between a first secondary terminal and a second secondary terminal of the resonant tank circuit. A voltage between the first and second primary terminals is a first voltage, and a voltage between the first and second secondary terminals is a second voltage. The secondary circuit includes two clamping switches, a switch bridge arm, and a capacitor bridge arm. The switch bridge arm includes a first secondary switch, a second secondary switch, a third secondary switch, and a fourth secondary switch sequentially connected in series. The two clamping switches are connected in series between a node between the first and second secondary switches and a node between the third and fourth secondary switches. A node between the second and third secondary switches is connected to the first secondary terminal. The capacitor bridge arm includes a first output capacitor and a second output capacitor connected in series. A node between the first and second output capacitors is connected to a node between the two clamping switches and the second secondary terminal. Two terminals of the capacitor bridge arm are connected to two terminals of the switch bridge arm, and a voltage between the two terminals of the capacitor bridge arm is an output voltage. The second secondary switch is at least in an on state for a preset time length after a falling edge in a period of the first voltage, and the third secondary switch is at least in the on state for the preset time length after a rising edge in the period of the first voltage.

BRIEF DESCRIPTION OF THE DRAWINGS

FIGS. 5A to 5F show the working state of the three-level rectification DC/DC converter of FIG. 1 in one period of the secondary switches;

DETAILED DESCRIPTION OF THE PREFERRED EMBODIMENT

The present disclosure will now be described more specifically regarding the following embodiments. It is to be noted that the following descriptions of preferred embodiments of this disclosure are presented herein for purpose of illustration and description only. It is not intended to be exhaustive or to be limited to the precise form disclosed.

Figure 1:
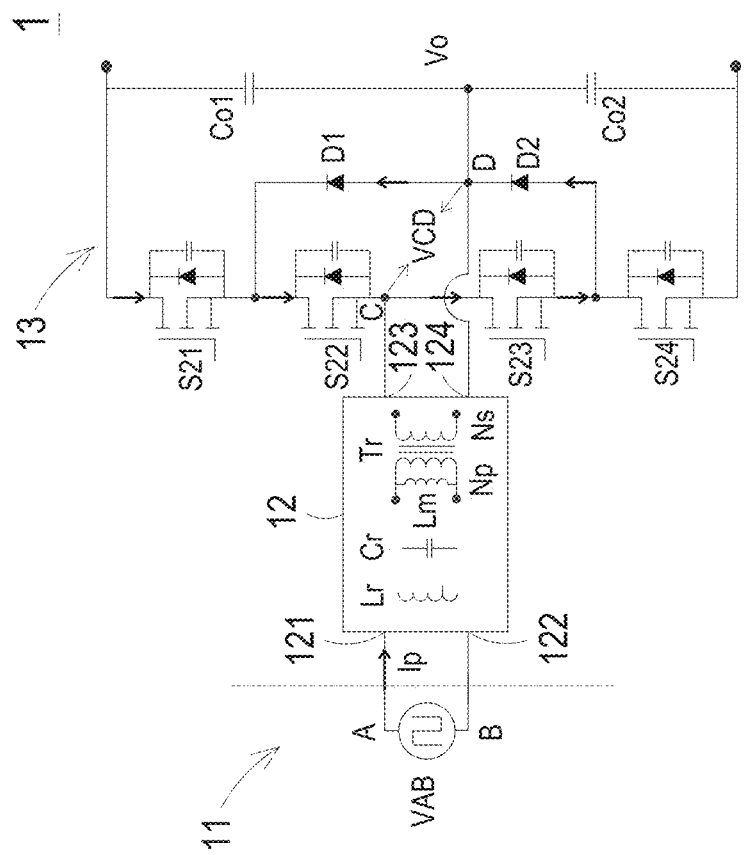
FIG. 1 is a schematic circuit diagram illustrating a three-level rectification DC/DC converter according to an embodiment of the present disclosure.
Figure 2:
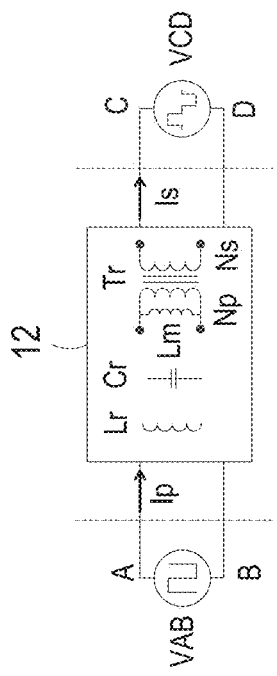
FIG. 2 schematically shows an equivalent circuit of the three-level rectification DC/DC converter of FIG. 1.

FIG. 1 is a schematic circuit diagram illustrating a three-level rectification DC/DC converter according to an embodiment of the present disclosure, and FIG. 2 schematically shows an equivalent circuit of the three-level rectification DC/DC converter of FIG. 1. As shown in FIG. 1 and FIG. 2, the three-level rectification DC/DC converter 1 includes a primary circuit 11, a resonant tank circuit 12, and a secondary circuit 13. The three-level rectification DC/DC converter 1 has the characteristic of resonant circuit and can meet the bidirectional work requirement.

The primary circuit 11 receives an input voltage Vin and includes a plurality of primary switches, and the primary circuit 11 is configured to provide a first voltage VAB. It is noted that the primary circuit 11 is represented by a voltage source which provides the first voltage VAB in this embodiment since the actual implementation of the primary circuit 11 is not limited. The specific implementation of the primary circuit 11 would be exemplified in the following descriptions.

The resonant tank circuit 12 includes a resonant inductor Lr, a resonant capacitor Cr, and a transformer Tr. A first primary terminal 121 and a second primary terminal 122 of the resonant tank circuit 12 are coupled to the primary circuit 11. A primary winding Np of the transformer Tr is coupled between the first primary terminal 121 and the second primary terminal 122. A secondary winding Ns of the transformer Tr is coupled between a first secondary terminal 123 and a second secondary terminal 124 of the resonant tank circuit 12. The voltage between the first primary terminal 121 and the second primary terminal 122 is the first voltage VAB, and the voltage between the first secondary terminal 123 and the second secondary terminal 124 is a second voltage VCD. In FIG. 1 and FIG. 2, Ip is the primary current, and Is is the secondary current.

The secondary circuit 13 includes two clamping switches D1 and D2, a switch bridge arm, and a capacitor bridge arm. The switch bridge arm includes a first secondary switch S21, a second secondary switch S22, a third secondary switch S23, and a fourth secondary switch S24 sequentially connected in series. The two clamping switches D1 and D2 are connected in series between a node between the first secondary switch S21 and the second secondary switch S22 and a node between the third secondary switch S23 and the fourth secondary switch S24. A node C between the second secondary switch S22 and the third secondary switch S23 is connected to the first secondary terminal 123. The capacitor bridge arm includes a first output capacitor Co1 and a second output capacitor Co2 connected in series. A node between the first output capacitor Co1 and the second output capacitor Co2 is connected to a node D between the two clamping switches D1 and D2 and the second secondary terminal 124. Two terminals of the capacitor bridge arm are connected to two terminals of the switch bridge arm respectively, and the voltage between the two terminals of the capacitor bridge arm is an output voltage Vo.

Figures 3A, 3B:
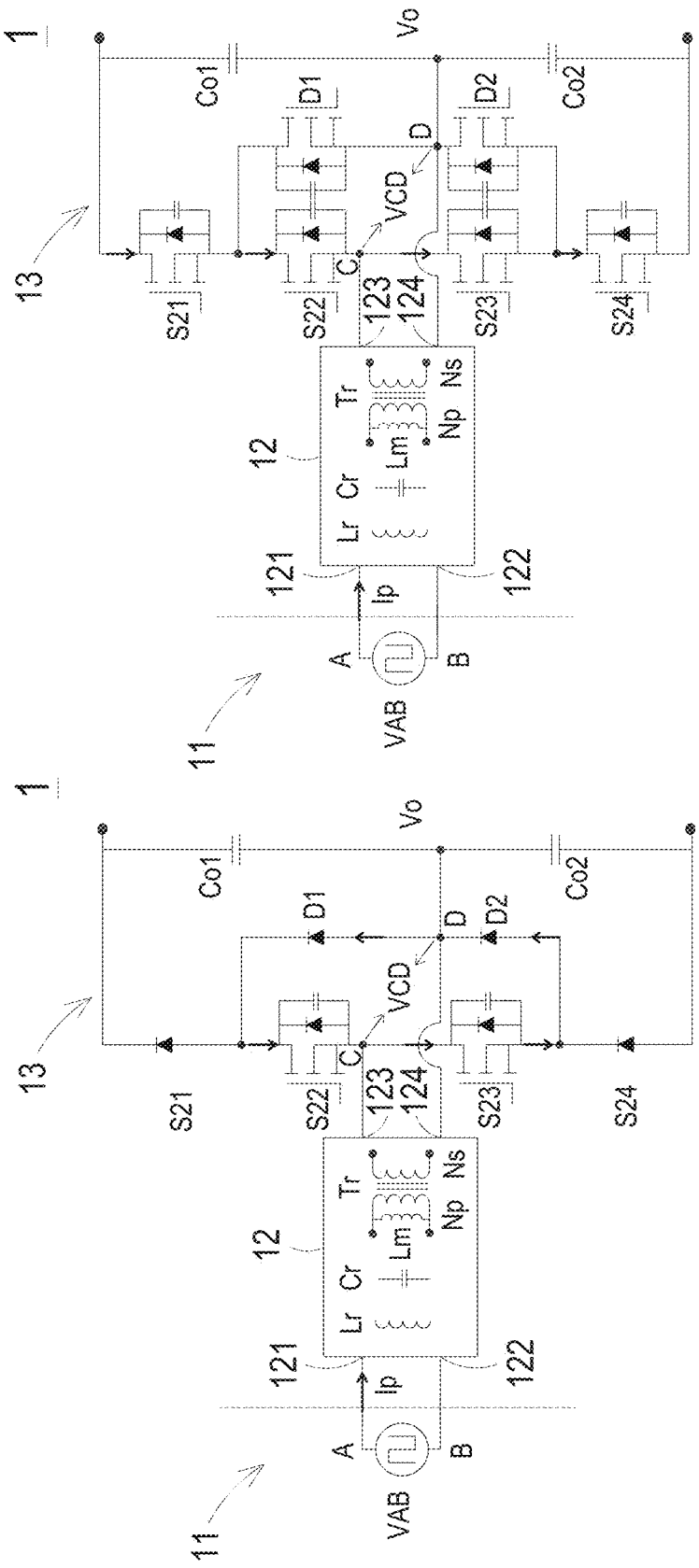
FIG. 3A and FIG. 3B show variants of the three-level rectification DC/DC converter of FIG. 1.

In the embodiment shown in FIG. 1, the first secondary switch S21, the second secondary switch S22, the third secondary switch S23, and the fourth secondary switch S24 are all active switches. In another embodiment, as exemplified in FIG. 3A, the first secondary switch S21 and the fourth secondary switch S24 may be a first diode and a second diode respectively. An anode and a cathode of the first diode are coupled to the second secondary switch S22 and the first output capacitor Co1 respectively. An anode and a cathode of the second diode are coupled to the second output capacitor Co2 and the third secondary switch S23 respectively.

In addition, in the embodiment shown in FIG. 1, the clamping switches D1 and D2 are a third diode and a fourth diode respectively. An anode and a cathode of the third diode are coupled to a cathode of the fourth diode and a node between the first secondary switch S21 and the second secondary switch S22 respectively. An anode of the fourth diode is coupled to a node between the third secondary switch S23 and the fourth secondary switch S24. In another embodiment, as exemplified in FIG. 3B, the clamping switches D1 and D2 may be active switches.

Figure 4:
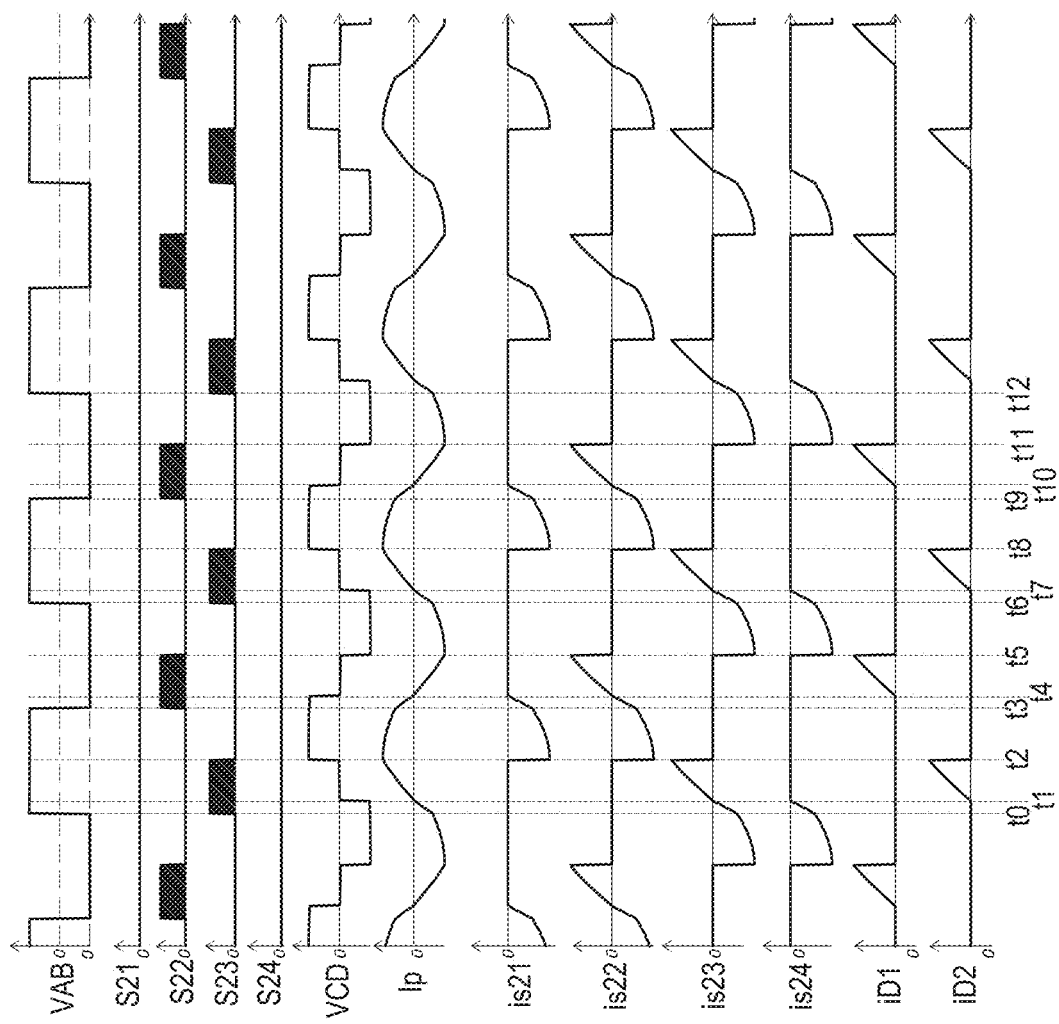
FIG. 4 is a schematic oscillogram showing the key waveforms of the three-level rectification DC/DC converter of FIG. 1.

FIG. 4 is a schematic oscillogram showing the key waveforms of the three-level rectification DC/DC converter of FIG. 1. In FIGS. 4, S21, S22, S23, and S24 represent the driving signals of the first secondary switch S21, the second secondary switch S22, the third secondary switch S23, and the fourth secondary switch S24 respectively; is21, is22, is23, and is24 represent the currents flowing through the first secondary switch S21, the second secondary switch S22, the third secondary switch S23, and the fourth secondary switch S24 respectively; and iD1 and iD2 represent the currents flowing through the clamping switches D1 and D2 respectively. As shown in FIG. 4, in any two consecutive periods of the first voltage VAB, the second secondary switch S22 is in an on state for a preset time length after the falling edge in the period of the first voltage VAB, and the third secondary switch S23 is in an on state for the preset time length after the rising edge in the period of the first voltage VAB. The first secondary switch S21 and the fourth secondary switch S24 are in diode rectification mode and are maintained in an off state. The second secondary switch S22 and the third secondary switch S23 have the same switching frequency equal to the frequency of the first voltage VAB. The phases of the second secondary switch S22 and the third secondary switch S23 are out of phase by 180 degrees with respect to each other. Further, all the secondary switches in secondary circuit 13 can be turned on with zero voltage switching. The said preset time length is obtained based on the input voltage Vin and the output voltage Vo. By controlling the preset time length, the duty ratio of each secondary switch can be adjusted, and the gain of the output voltage Vo can be controlled. In addition, the first voltage VAB is a square wave which is at a high level in one-half period and at a low level in the other half period, where the high level and the low level may be equal to +VAB/2 and −VAB/2 respectively, or equal to +VAB and 0 respectively.

Figure 5B:
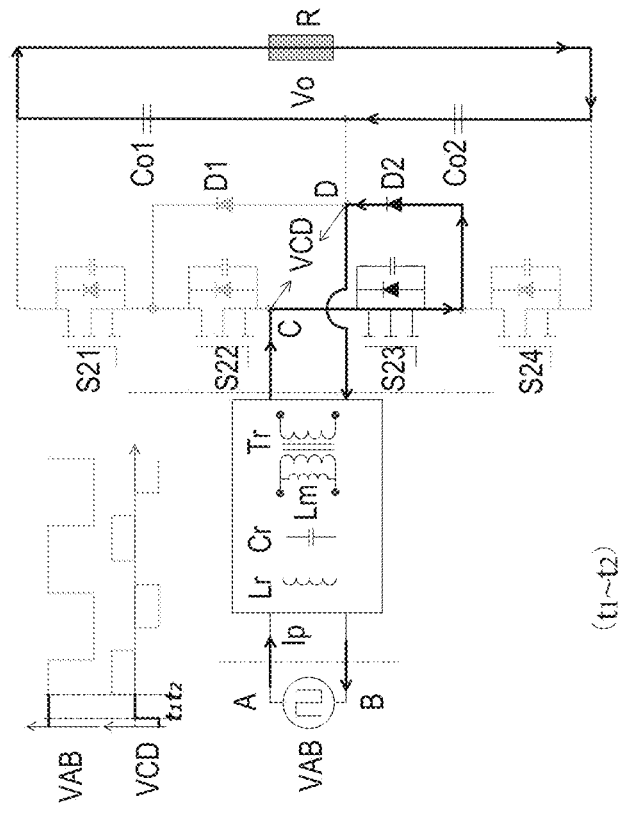
Figure 5A:
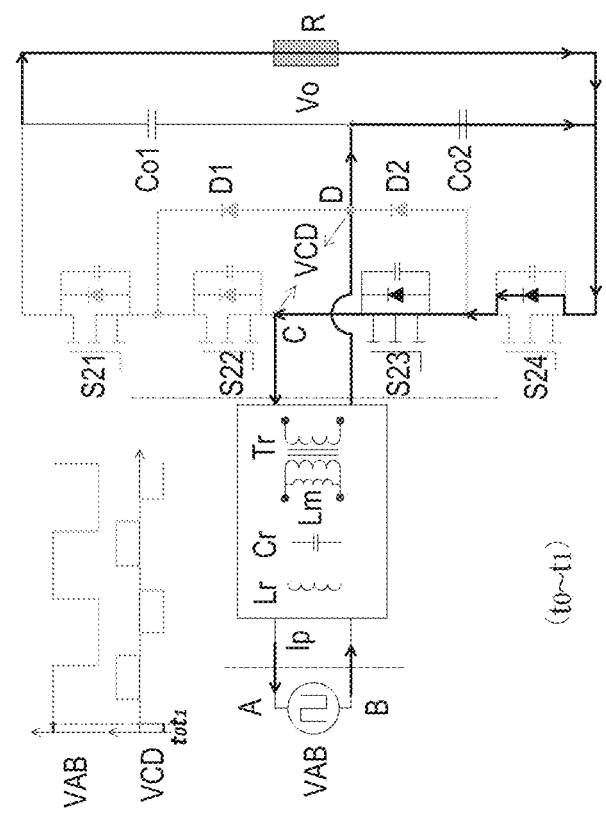
Figures 5E, 5F:
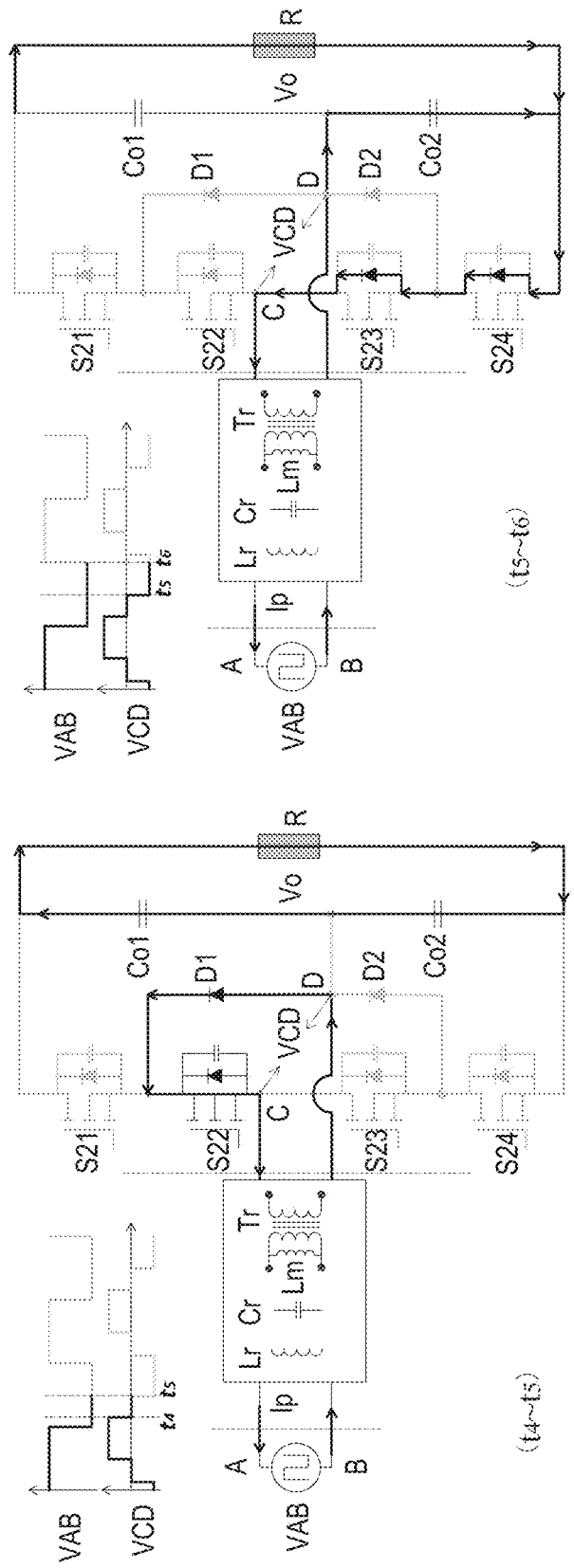
Figure 6B:
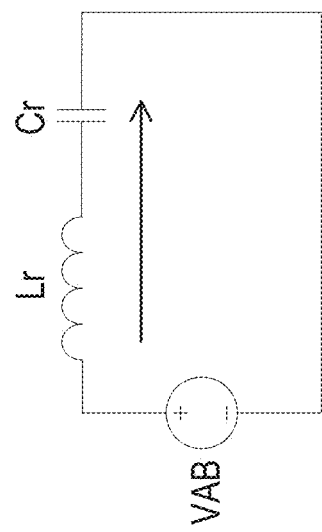
FIG. 6B shows an equivalent circuit of the three-level rectification DC/DC converter of FIG. 1 while the first voltage is at a low level and the secondary switches being turned on positively.
Figure 6A:
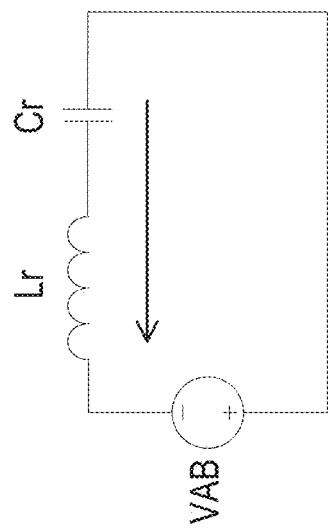
FIG. 6A shows an equivalent circuit of the three-level rectification DC/DC converter of FIG. 1 while the first voltage is at a high level and the secondary switches being turned on positively.

In FIG. 4, the duration from time t0 to t6 is regarded as one period of the secondary switches. FIGS. 5A to 5F show the working state of the three-level rectification DC/DC converter of FIG. 1 in one period. In specific, FIGS. 5A to 5F show the switching state and the current flowing direction of the three-level rectification DC/DC converter 1 within one period. The duration from time t1 to t2 (FIG. 5B) and the duration from time t4 to t5 (FIG. 5E) respectively correspond to the durations of the third secondary switch S23 and the second secondary switch S22 being turned on positively. FIGS. 5B and 5E show the corresponding working states of the three-level rectification DC/DC converter 1. The equivalent circuit of the three-level rectification DC/DC converter 1 during the duration from time t1 to t2 is shown in FIG. 6A. The equivalent circuit of the three-level rectification DC/DC converter 1 during the duration from time t4 to t5 is shown in FIG. 6B. From FIGS. 5B, 5E, 6A, and 6B, it can be seen that the secondary circuit 13 is equivalent to be in a short-circuit state when the third secondary switch S23 and the second secondary switch S22 are turned on positively. At this time, the energy is stored in the resonant inductor Lr through the first voltage VAB, which prepares for the high-gain energy output in the next duration.

From the above descriptions, in the three-level rectification DC/DC converter 1 of the present disclosure, through controlling the four secondary switches, the energy is stored in the resonant inductor Lr during the operating process, thereby achieving the high-gain voltage output.

In an embodiment, to further improve the work efficiency of the three-level rectification DC/DC converter 1, the secondary switches may be controlled with synchronous rectification. Namely, the secondary switch is driven during the current flowing reversely therethrough, thereby reducing the conduction loss of the secondary switches.

Figure 7:
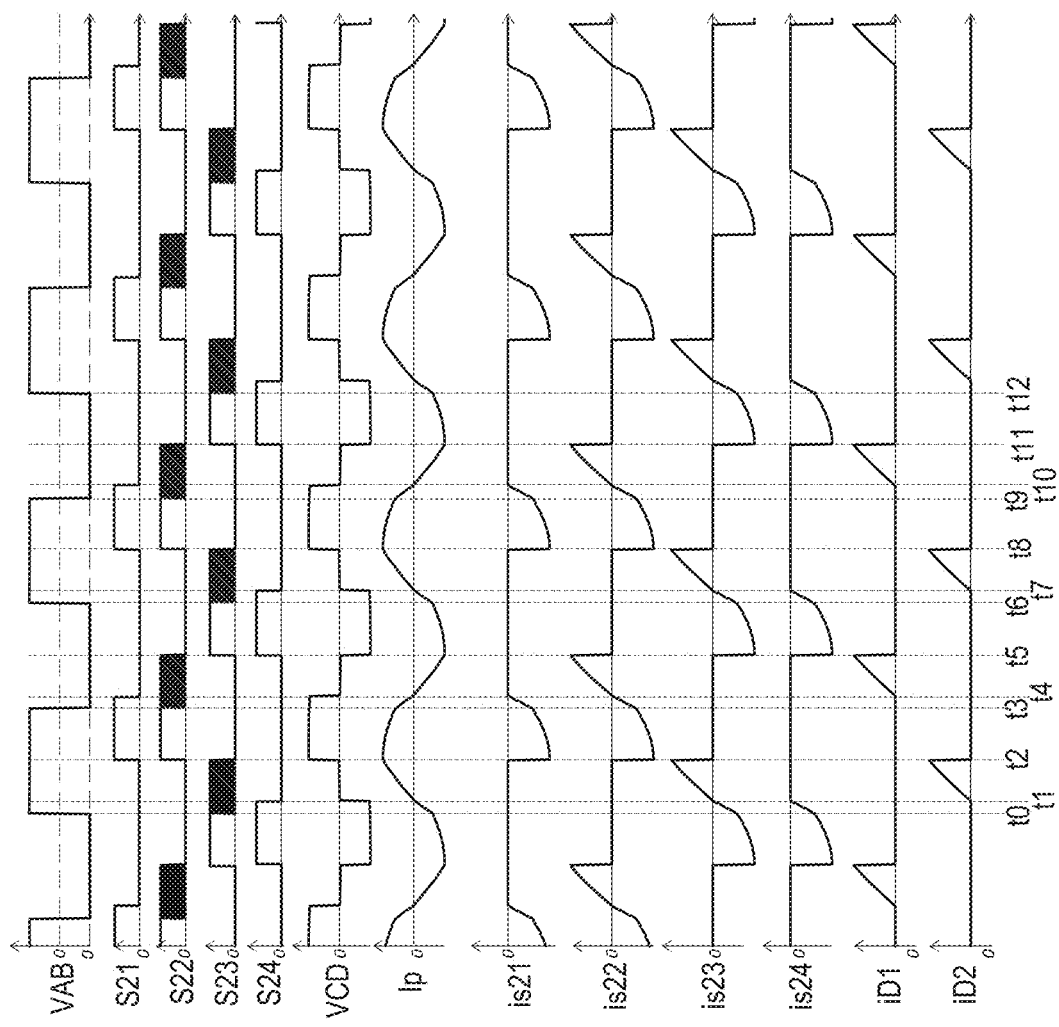
FIG. 7 is a schematic oscillogram showing the key waveforms of the three-level rectification DC/DC converter of FIG. 1 while applying complete synchronous rectification to the secondary switches.

FIG. 7 is a schematic oscillogram showing the key waveforms of the three-level rectification DC/DC converter of FIG. 1 while applying complete synchronous rectification to the secondary switches. As shown in FIG. 7, while applying the complete synchronous rectification, in addition to the durations of being in the on state shown in FIG. 4, the first secondary switch S21, the second secondary switch S22, the third secondary switch S23, and the fourth secondary switch S24 are further in the on state during all durations within the duration of the currents flowing reversely through the first secondary switch S21, the second secondary switch S22, the third secondary switch S23, and the fourth secondary switch S24 respectively. In this embodiment, the driving signals of the second secondary switch S22 and the third secondary switch S23 are complementary and have the same duty ratio of 50%. A phase difference between the driving signals of the first secondary switch S21 and the fourth secondary switch S24 is 180 degrees, and a phase difference between the driving signals of the second secondary switch S22 and the third secondary switch S23 is 180 degrees.

In addition, depending on whether the switching frequency of primary switches is variable, the control for the three-level rectification DC/DC converter 1 of the present disclosure may be divided into a variable frequency control and a fixed-frequency control.

Figure 8A:
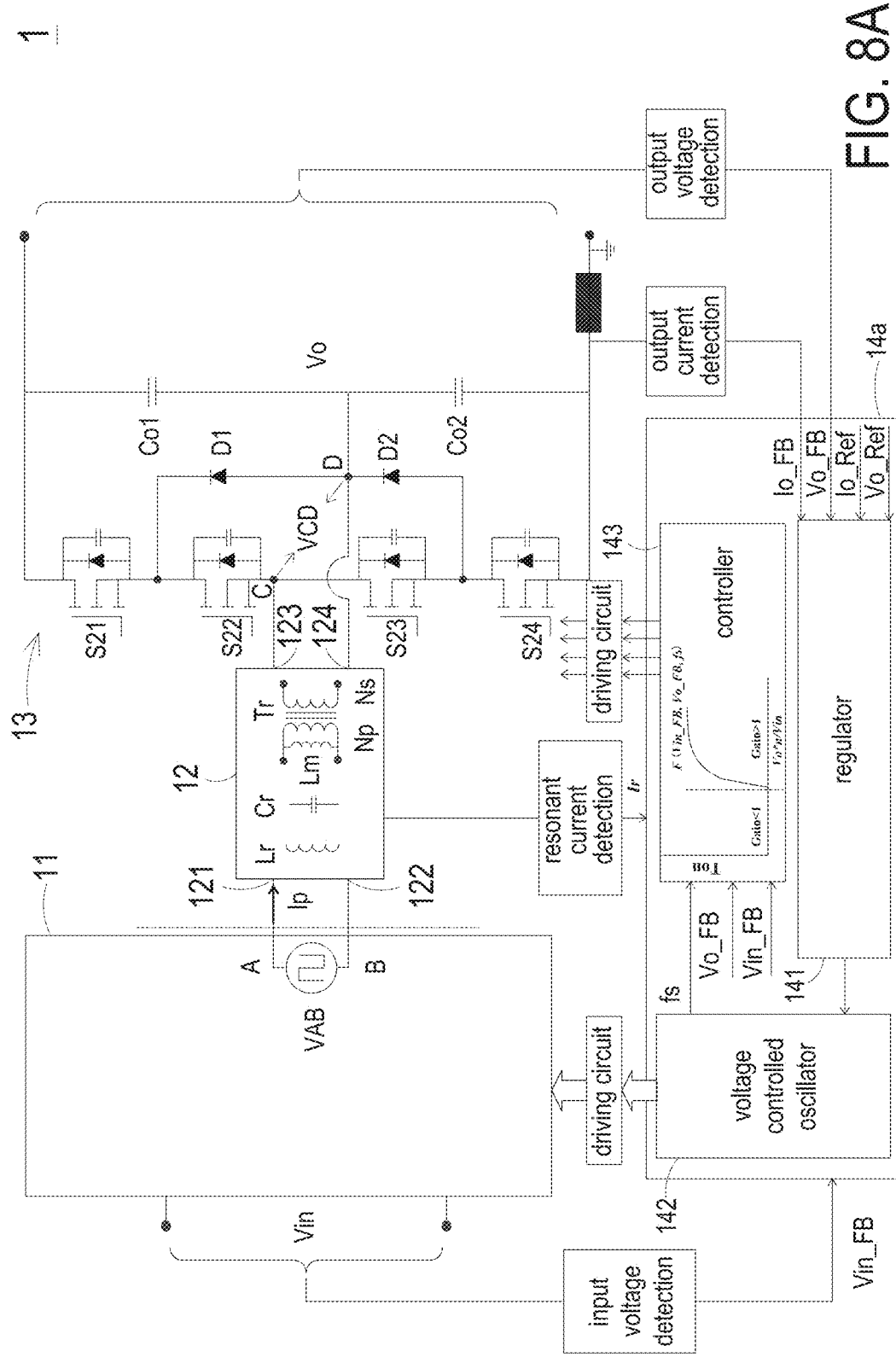
FIG. 8A is a schematic block diagram illustrating the variable frequency control applied to the three-level rectification DC/DC converter of FIG. 1.

FIG. 8A is a schematic block diagram illustrating the variable frequency control applied to the three-level rectification DC/DC converter of FIG. 1. While applying the variable frequency control, as shown in FIG. 8A, the three-level rectification DC/DC converter 1 further includes a control module 14a. The control module 14a is configured to acquire an input voltage signal Vin_FB, an output voltage signal Vo_FB, and an output current signal Io_FB reflecting the input voltage Vin, the output voltage Vo, and the output current Io respectively through detection, and to control the operation of all the primary and secondary switches. The control module 14a includes a regulator 141, and the regulator 141 generates a regulating signal according to the output voltage signal Vo_FB, the output current signal Io_FB, an output reference voltage Vo_ref, and an output reference current Io_ref. In this embodiment, the control module 14a further includes a voltage-controlled oscillator 142 and a controller 143. The voltage-controlled oscillator 142 is coupled to the regulator 141 and generates a switching frequency fs of all the primary switches according to the regulating signal. The controller 143 is coupled to the voltage-controlled oscillator 142, and generates an on-time Ton of all the secondary switches according to the input voltage signal Vin_FB, the output voltage signal Vo_FB, and the switching frequency fs of all the primary switches. When the turns ratio n of the transformer Tr is fixed, the relations among the on-time Ton of all the secondary switches, the input voltage Vin, the output voltage Vo and the switching frequency fs of all the primary switches are conformed with the curve shown in FIG. 8A. In actual applications, the on-time Ton of the secondary switches may be obtained through calculation or look-up table.

Figure 8B:
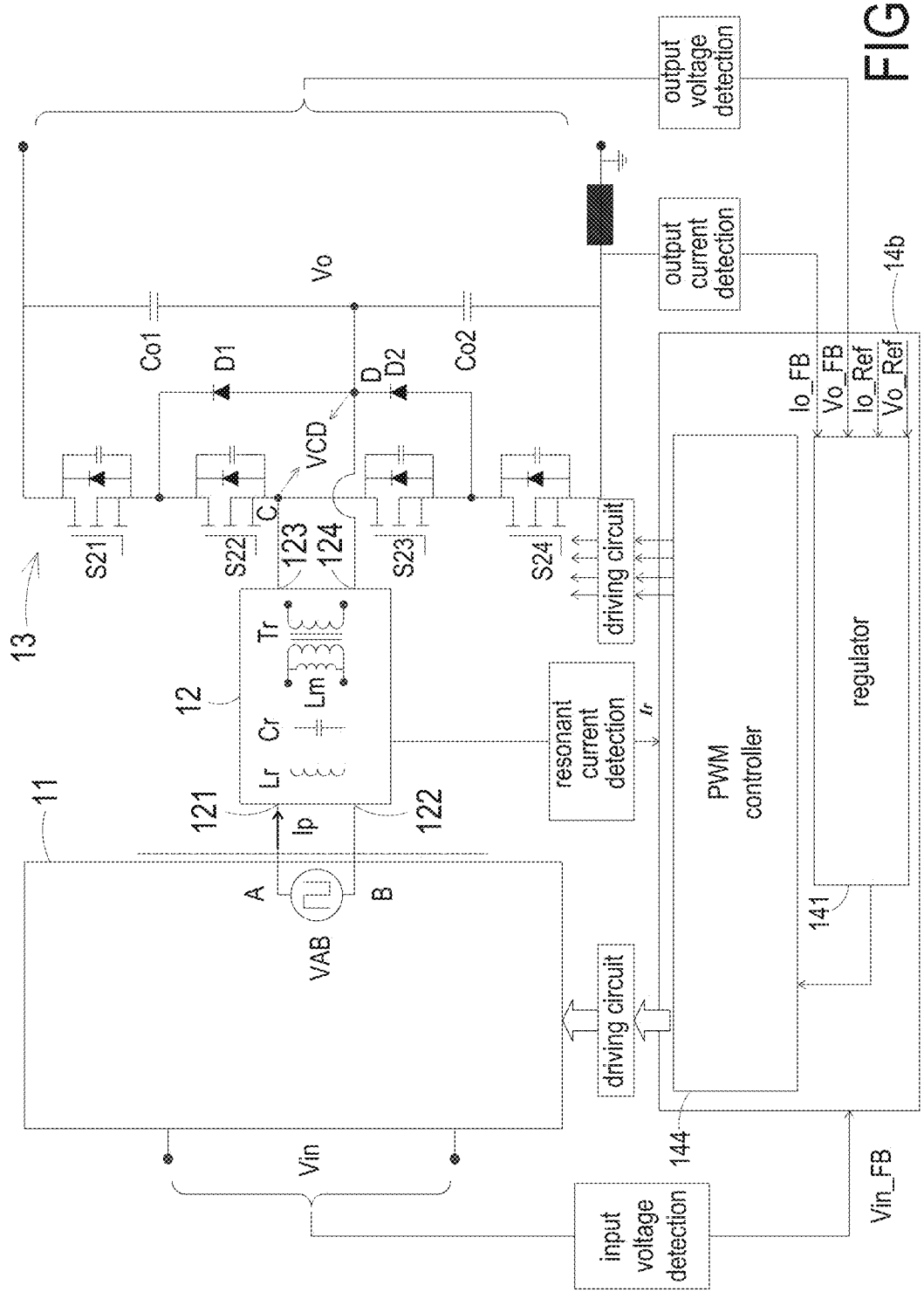
FIG. 8B is a schematic block diagram illustrating the fixed-frequency control applied to the three-level rectification DC/DC converter of FIG. 1.

FIG. 8B is a schematic block diagram illustrating the fixed-frequency control applied to the three-level rectification DC/DC converter of FIG. 1. While applying the fixed-frequency control, the switching frequency fs of all the primary switches is fixed and is larger than the resonant frequency of the resonant tank circuit 12. As shown in FIG. 8B, the three-level rectification DC/DC converter 1 further includes a control module 14b. The control module 14b is configured to acquire an input voltage signal Vin_FB, an output voltage signal Vo_FB and an output current signal Io_FB reflecting the input voltage Vin, the output voltage Vo and the output current Io respectively through detection, and to control the operation of all the primary and secondary switches. The control module 14b includes a regulator 141, and the regulator 141 generates a regulating signal according to the output voltage signal Vo_FB, the output current signal Io_FB, an output reference voltage Vo_ref, and an output reference current Io_ref. In this embodiment, the control module 14b further includes a PWM controller 144. The PWM controller 144 is coupled to the regulator 141, and generates the driving signals of all the primary and secondary switches according to the regulating signal.

Figure 9:
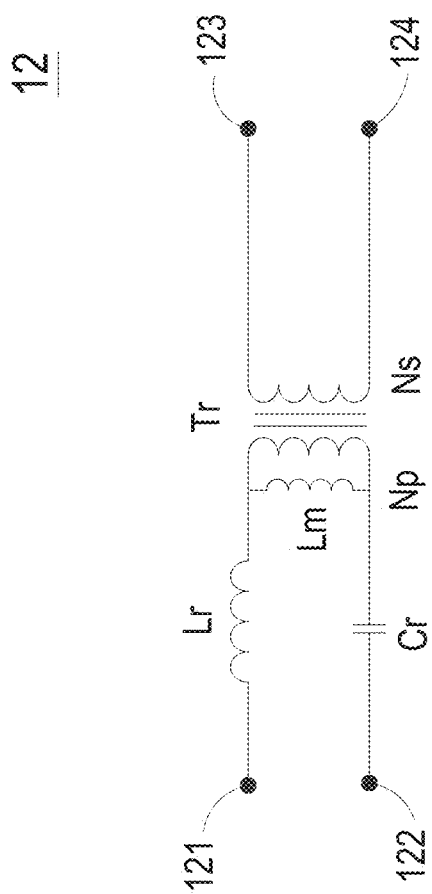
FIG. 9 schematically shows a specific implementation of the resonant tank circuit of FIG. 1.

In addition, in the three-level rectification DC/DC converter 1 of the present disclosure, the resonant inductor Lr and the resonant capacitor Cr of the resonant tank circuit 12 have various kinds of actual implementations. FIG. 9 schematically shows a specific implementation of the resonant tank circuit 12. In the embodiment shown in FIG. 9, the resonant inductor Lr, the primary winding Np, and the resonant capacitor Cr are sequentially connected between the first primary terminal 121 and the second primary terminal 122 in series, but not limited thereto. For example, the resonant capacitor Cr may be connected in series between the secondary winding Ns and the second secondary terminal 124, and the resonant inductor Lr may be connected in series between the secondary winding Ns and the first secondary terminal 123. Further, as exemplified in FIG. 10, in an embodiment, the resonant inductor Lr includes a primary resonant inductor Lrp and a secondary resonant inductor Lrs, the primary resonant inductor Lrp is connected in series between the primary winding Np and the first primary terminal 121, and the secondary resonant inductor Lrs is connected in series between the secondary winding Ns and the first secondary terminal 123. In an embodiment, the resonant capacitor Cr includes a primary resonant capacitor Crp and a secondary resonant capacitor Crs, the primary resonant capacitor Crp is connected in series between the primary winding Np and the second primary terminal 122, and the secondary resonant capacitor Crs is connected in series between the secondary winding Ns and the second secondary terminal 124.

Moreover, in the three-level rectification DC/DC converter 1 of the present disclosure, the actual circuit topology of the primary circuit is not limited, and the primary circuit is for example but not limited to a full-bridge circuit, a half-bridge circuit, a serial-half-bridge circuit, a three-level circuit with a flying capacitor, or a three-level circuit with the clamped midpoint. Two kinds of actual circuit topologies of the primary circuit are exemplified as follows.

Figure 10:
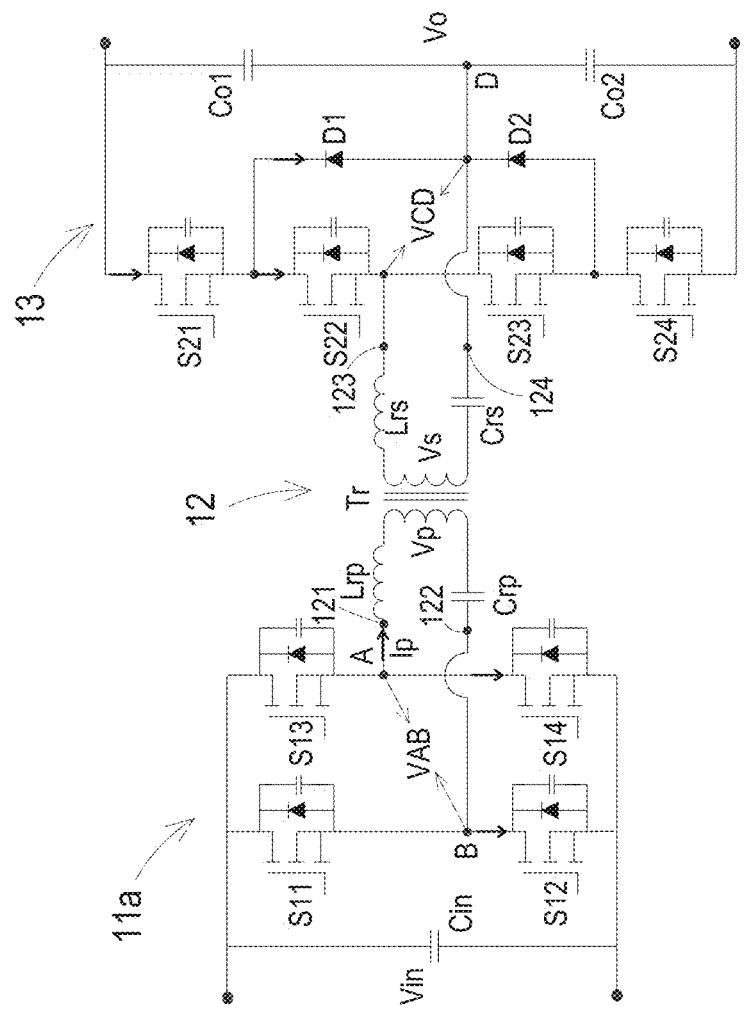
FIG. 10 schematically shows a specific implementation of the primary circuit of FIG. 1.
Figure 11:
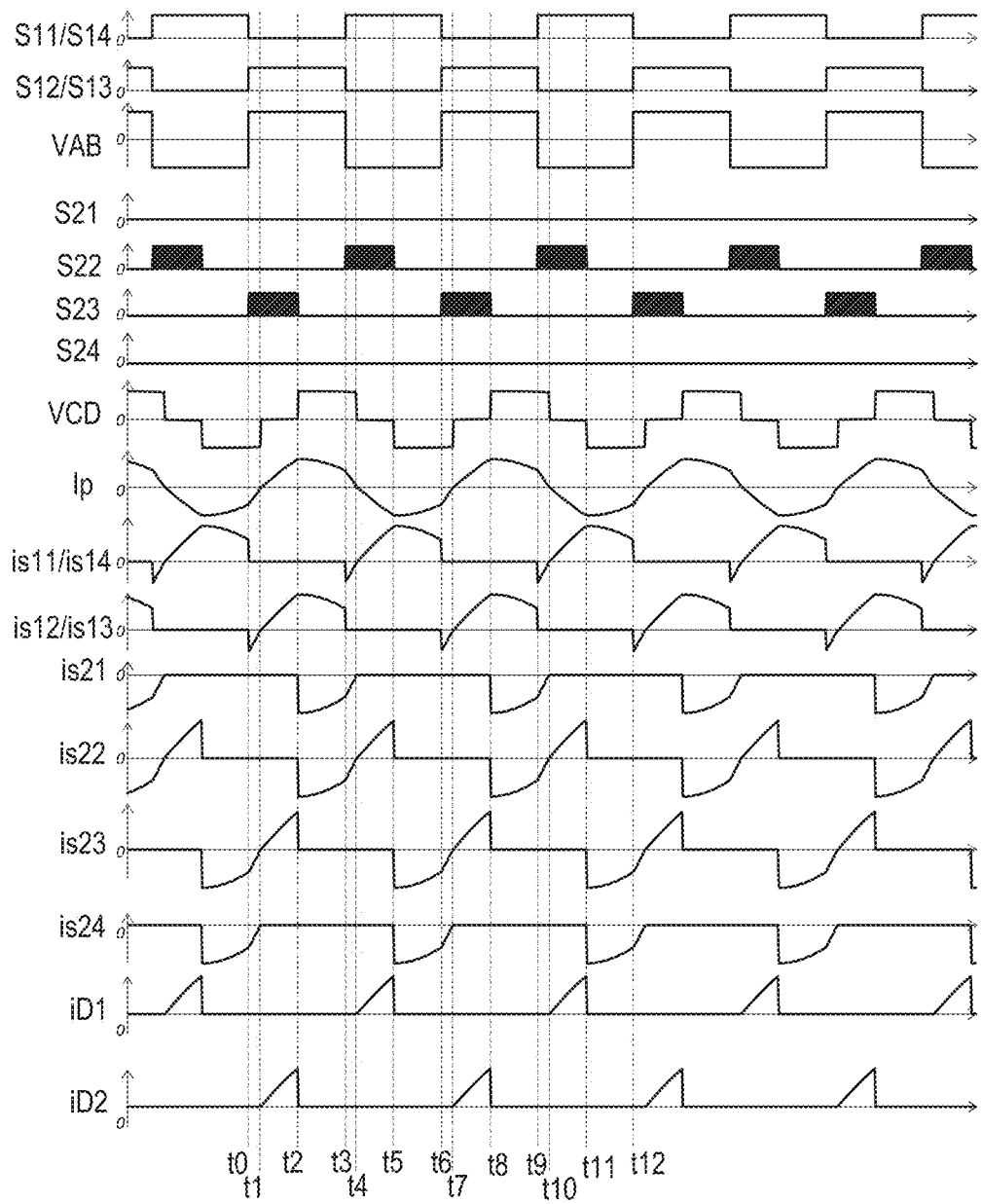
FIG. 11 is a schematic oscillogram showing the key waveforms of the three-level rectification DC/DC converter of FIG. 10.
Figure 12:
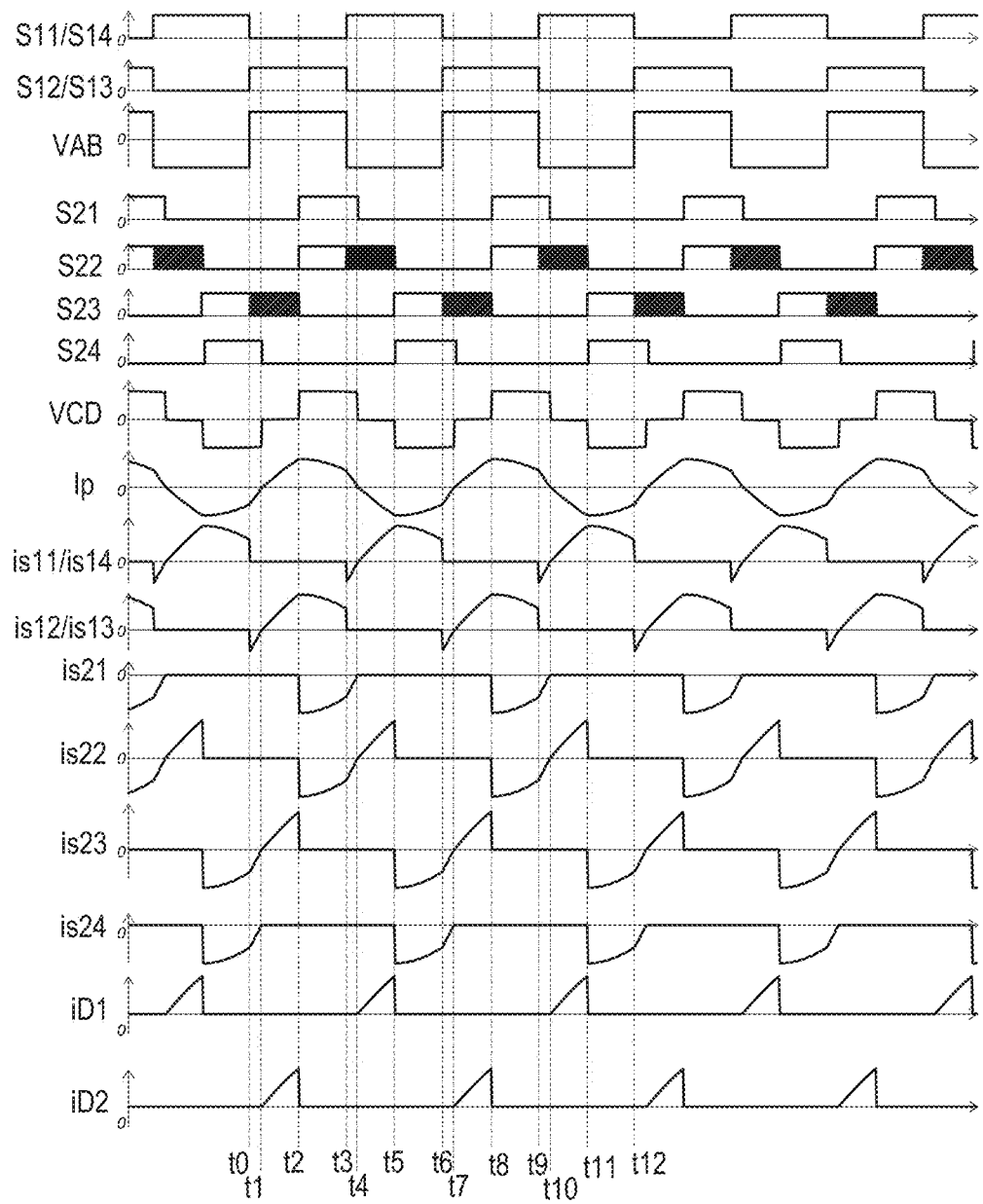
FIG. 12 is a schematic oscillogram showing the key waveforms of the three-level rectification DC/DC converter of FIG. 10 while applying complete synchronous rectification to the secondary switches.

In an embodiment, as shown in FIG. 10, the primary circuit 11a is a full-bridge circuit, and the primary circuit 11a includes an input capacitor Cin, a first bridge arm, and a second bridge arm connected to each other in parallel. The voltage on the input capacitor Cin is the input voltage Vin. The first bridge arm includes a first primary switch S11 and a second primary switch S12 connected in series, and a node B between the first primary switch S11 and the second primary switch S12 is connected to the second primary terminal 122. The second bridge arm includes a third primary switch S13 and a fourth primary switch S14, and a node A between the third primary switch S13 and the fourth primary switch S14 is connected to the first primary terminal 121. All the primary switches in the primary circuit 11a can be turned on with zero voltage switching. FIG. 11 is a schematic oscillogram showing the key waveforms of the three-level rectification DC/DC converter of FIG. 10. FIG. 12 is a schematic oscillogram showing the key waveforms of the three-level rectification DC/DC converter of FIG. 10 while applying complete synchronous rectification to the secondary switches.

Figure 13:
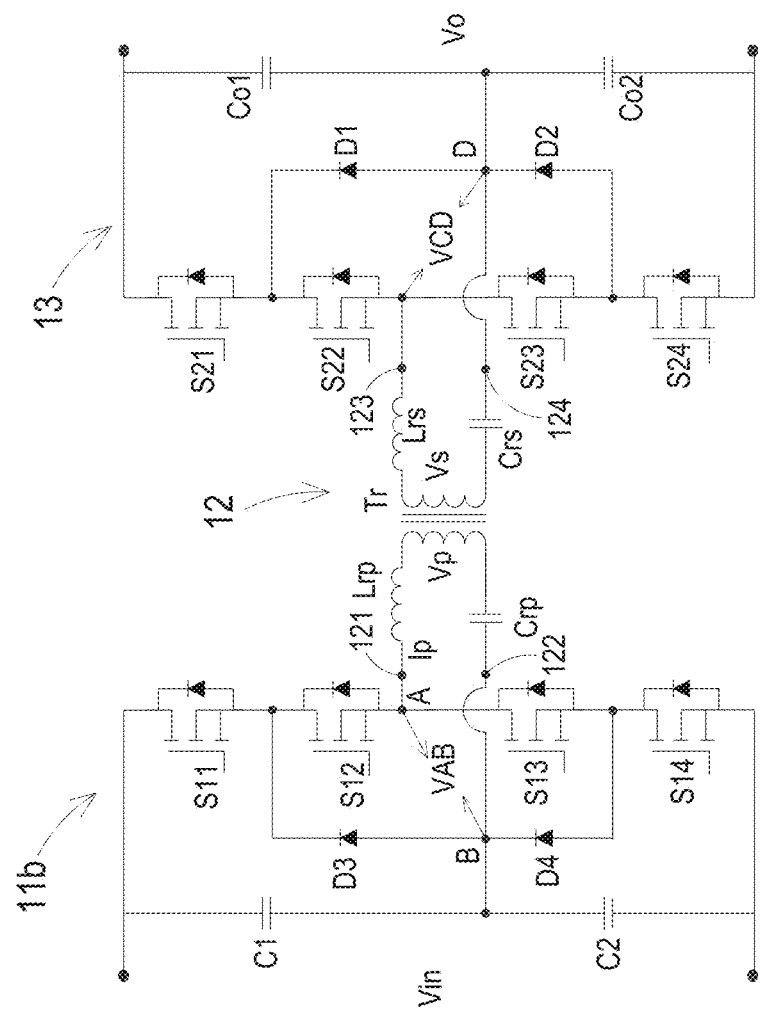
FIG. 13 schematically shows another specific implementation of the primary circuit of FIG. 1.
Figure 14:
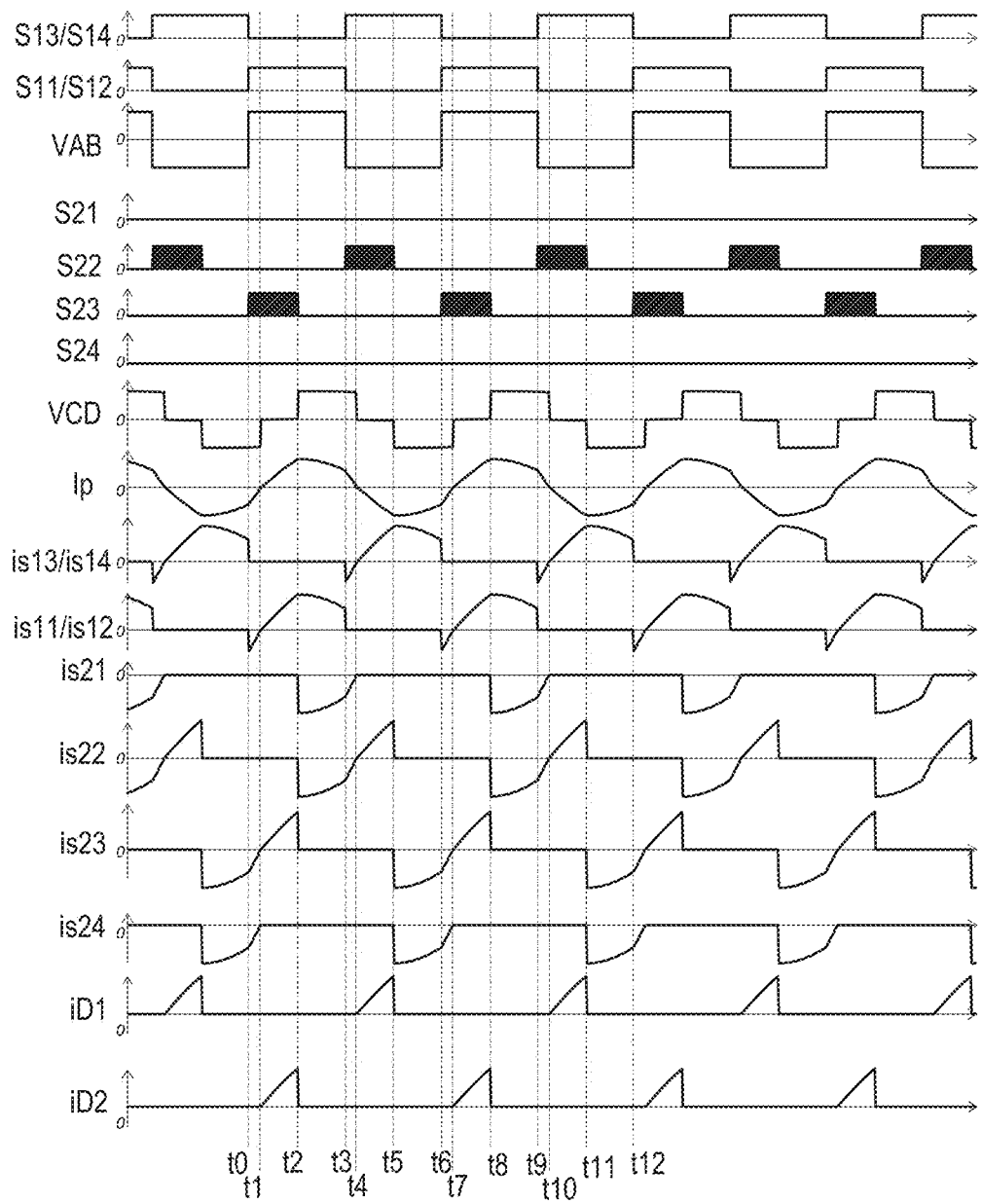
FIG. 14 is a schematic oscillogram showing the key waveforms of the three-level rectification DC/DC converter of FIG. 13.
Figure 15:
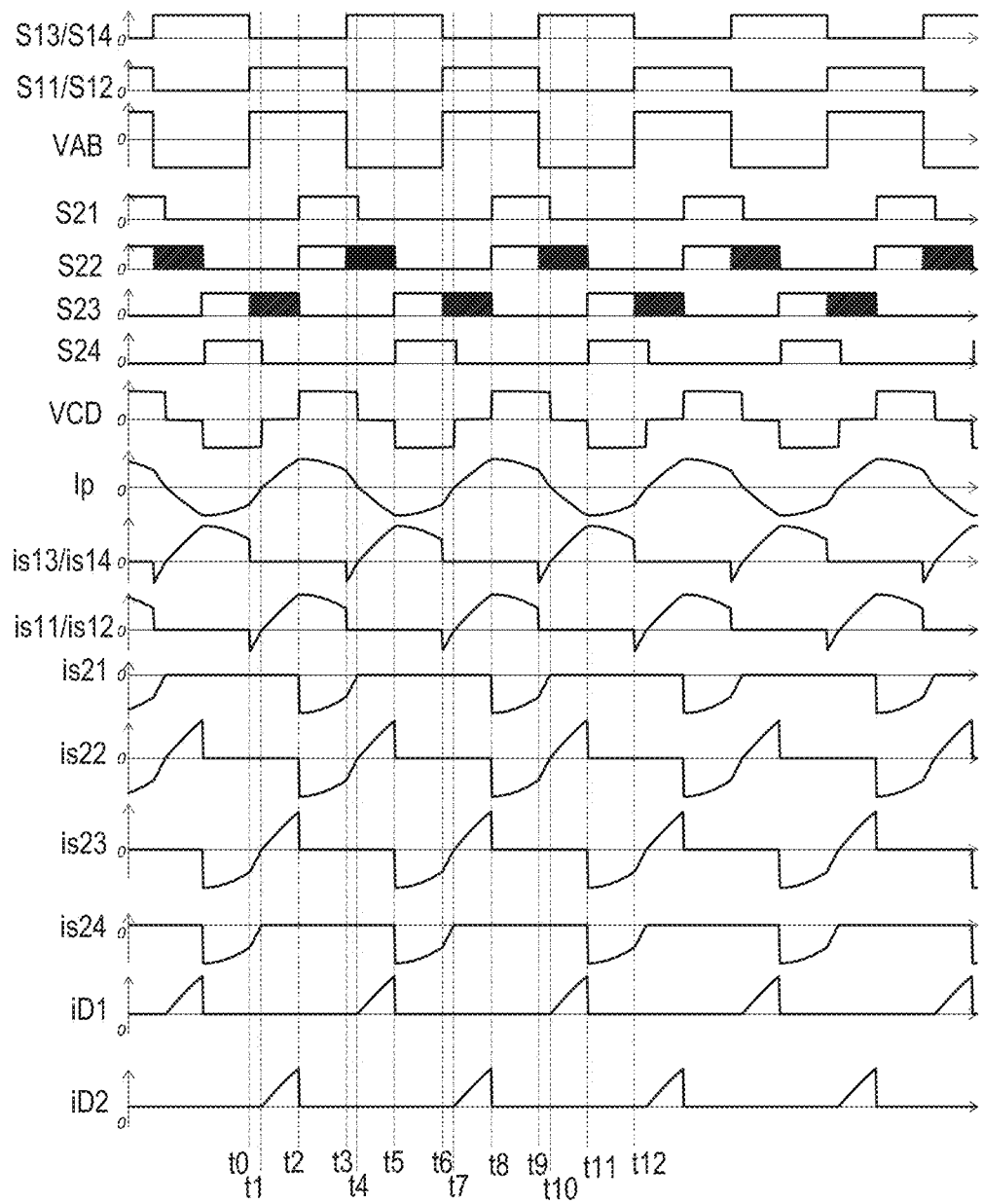
FIG. 15 is a schematic oscillogram showing the key waveforms of the three-level rectification DC/DC converter of FIG. 13 while applying complete synchronous rectification to the secondary switches.

In an embodiment, as shown in FIG. 13, the primary circuit 11b is a three-level circuit with a clamped midpoint, and the primary circuit 11b includes two primary clamping switches D3 and D4, a first bridge arm, and a second bridge arm. The voltage between the two terminals of the first bridge arm is the input voltage Vin, and the two terminals of the first bridge arm are connected to two terminals of the second bridge arm respectively. The first bridge arm includes a first input capacitor C1 and a second input capacitor C2 connected in series. The second bridge arm includes a first primary switch S11, a second primary switch S12, a third primary switch S13, and a fourth primary switch S14 sequentially connected in series. The two primary clamping switches D3 and D4 are connected in series between a node between the first primary switch S11 and the second primary switch S12 and a node between the third primary switch S13 and the fourth primary switch S14. A node A between the second primary switch S12 and the third primary switch S13 is connected to the first primary terminal 121, and a node between the first input capacitor C1 and the second input capacitor C2 is connected to a node B between the two primary clamping switches D3 and D4 and the second primary terminal 122. All the primary switches in the primary circuit 11b can be turned on with zero voltage switching. FIG. 14 is a schematic oscillogram showing the key waveforms of the three-level rectification DC/DC converter of FIG. 13. FIG. 15 is a schematic oscillogram showing the key waveforms of the three-level rectification DC/DC converter of FIG. 13 while applying complete synchronous rectification to the secondary switches.

In summary, the present disclosure provides a three-level rectification DC/DC converter which has the characteristic of a resonant circuit and can meet the bidirectional work requirement. In addition, the three-level rectification DC/DC converter has the characteristic of storing energy through short-circuiting the secondary circuit thereof, thereby achieving the output with high voltage gain. Since the highest voltage on the secondary switch equals one-half of the output voltage, the secondary switch can be implemented by switch components with low withstand voltage, which makes the selection for switch components easier and reduces the cost. Moreover, through controlling the four secondary switches, the energy is stored in the resonant inductor during the operating process by the secondary circuit equivalent to be short-circuited, thereby achieving the high-gain voltage output.

While the disclosure has been described in terms of what is presently considered to be the most practical and preferred embodiments, it is to be understood that the disclosure needs not to be limited to the disclosed embodiment. On the contrary, it is intended to cover various modifications and similar arrangements included within the spirit and scope of the appended claims which are to be accorded with the broadest interpretation to encompass all such modifications and similar structures.

What is claimed is:

1. A three-level rectification DC/DC converter, comprising:
    a primary circuit receiving an input voltage and comprising a plurality of primary switches;
    a resonant tank circuit comprising a resonant inductor, a resonant capacitor, and a transformer, wherein a first primary terminal and a second primary terminal of the resonant tank circuit are coupled to the primary circuit, a primary winding of the transformer is coupled between the first and second primary terminals, a secondary winding of the transformer is coupled between a first secondary terminal and a second secondary terminal of the resonant tank circuit, a voltage between the first and second primary terminals is a first voltage, a voltage between the first and second secondary terminals is a second voltage; and
    a secondary circuit comprising two clamping switches, a switch bridge arm, and a capacitor bridge arm, wherein the switch bridge arm comprises a first secondary switch, a second secondary switch, a third secondary switch, and a fourth secondary switch sequentially connected in series, the two clamping switches are connected in series between a node between the first and second secondary switches and a node between the third and fourth secondary switches, a node between the second and third secondary switches is connected to the first secondary terminal, the capacitor bridge arm comprises a first output capacitor and a second output capacitor connected in series, a node between the first and second output capacitors is connected to a node between the two clamping switches and the second secondary terminal, two terminals of the capacitor bridge arm are connected to two terminals of the switch bridge arm, and a voltage between the two terminals of the capacitor bridge arm is an output voltage, wherein the second secondary switch is at least in an on state for a preset time length after a falling edge in a period of the first voltage, and the third secondary switch is at least in the on state for the preset time length after a rising edge in the period of the first voltage, wherein the three-level rectification DC/DC converter operates in a continuous current mode, wherein if the first secondary switch and the fourth secondary switches are kept in an off state, the second secondary switch is switched from the off state to the on state at the falling edge in the period of the first voltage and is in the on state for the preset time length after the falling edge, and the third secondary switch is switched from the off state to the on state at the rising edge in the period of the first voltage and is in the on state for the preset time length after the rising edge.

2. The three-level rectification DC/DC converter according to claim 1, wherein phases of the second and third secondary switches are out of phase by 180 degrees with respect to each other.

3. The three-level rectification DC/DC converter according to claim 1, wherein a switching frequency of the second and third secondary switches is equal to a frequency of the first voltage.

4. The three-level rectification DC/DC converter according to claim 1, wherein if the first and fourth secondary switches are not kept in the off state, the first, second, third, and fourth secondary switches are in the on state during all durations within a duration of currents flowing reversely through the first, second, third, and fourth secondary switches respectively.

5. The three-level rectification DC/DC converter according to claim 4, wherein driving signals of the second and third secondary switches are complementary.

6. The three-level rectification DC/DC converter according to claim 1, wherein the preset time length is obtained based on the input voltage and the output voltage.

7. The three-level rectification DC/DC converter according to claim 1, wherein all the primary and secondary switches are turned on with zero voltage switching.

8. The three-level rectification DC/DC converter according to claim 1, wherein the first voltage is a square wave which is at a high level in one-half period and at a low level in the other half period.

9. The three-level rectification DC/DC converter according to claim 1, wherein the first and fourth secondary switches are active switches.

10. The three-level rectification DC/DC converter according to claim 1, wherein the first and fourth secondary switches are a first diode and a second diode respectively, an anode and a cathode of the first diode are coupled to the second secondary switch and the first output capacitor respectively, and an anode and a cathode of the second diode are coupled to the second output capacitor and the third secondary switch respectively.

11. The three-level rectification DC/DC converter according to claim 1, wherein the two clamping switches are active switches.

12. The three-level rectification DC/DC converter according to claim 1, wherein the two clamping switches are a third diode and a fourth diode, an anode and a cathode of the third diode are coupled a cathode of the fourth diode and a node between the first and second secondary switches respectively, and an anode of the fourth diode is coupled to a node between the third and fourth secondary switches.

13. The three-level rectification DC/DC converter according to claim 1, wherein the primary circuit comprises an input capacitor, a first bridge arm, and a second bridge arm connected to each other in parallel, a voltage on the input capacitor is the input voltage, the first bridge arm comprises a first primary switch and a second primary switch connected in series, a node between the first and second primary switches is connected to the second primary terminal, the second bridge arm comprises a third primary switch and a fourth primary switch, and a node between the third and fourth primary switches is connected to the first primary terminal.

14. The three-level rectification DC/DC converter according to claim 1, wherein the primary circuit comprises two primary clamping switches, a first bridge arm, and a second bridge arm, a voltage between two terminals of the first bridge arm is the input voltage, the two terminals of the first bridge arm are connected to two terminals of the second bridge arm respectively, the first bridge arm comprises a first input capacitor and a second input capacitor connected in series, the second bridge arm comprises a first primary switch, a second primary switch, a third primary switch, and a fourth primary switch sequentially connected in series, the two primary clamping switches are connected in series between a node between the first and second primary switches and a node between the third and fourth primary switches, a node between the second and third primary switches is connected to the first primary terminal, and a node between the first and second input capacitors is connected to a node between the two primary clamping switches and the second primary terminal.

15. The three-level rectification DC/DC converter according to claim 1, wherein in the resonant tank circuit, the resonant inductor, the primary winding, and the resonant capacitor are connected in series between the first and second primary terminals.

16. The three-level rectification DC/DC converter according to claim 1, further comprising a control module, wherein the control module is configured to acquire an input voltage signal, an output voltage signal, and an output current signal reflecting the input voltage, the output voltage, and an output current respectively through detection and to control the operation of all the primary and secondary switches, the control module comprises a regulator, and the regulator generates a regulating signal according to the output voltage signal, the output current signal, an output reference voltage, and an output reference current.

17. The three-level rectification DC/DC converter according to claim 16, wherein the control module further comprises a voltage-controlled oscillator and a controller, the voltage-controlled oscillator is coupled to the regulator and generates a switching frequency of the plurality of primary switches according to the regulating signal, the controller is coupled to the voltage-controlled oscillator, and the controller generates an on-time of all the secondary switches according to the input voltage signal, the output voltage signal and the switching frequency of the plurality of primary switches.

18. The three-level rectification DC/DC converter according to claim 16, wherein the control module further comprises a PWM controller coupled to the regulator, and the PWM controller generates driving signals of all the primary and secondary switches according to the regulating signal.

19. The three-level rectification DC/DC converter according to claim 18, wherein a switching frequency of the plurality of primary switches is fixed and is larger than a resonant frequency of the resonant tank circuit.

* * * * *